(12) United States Patent
Cook et al.

(10) Patent No.: US 9,689,899 B2
(45) Date of Patent: Jun. 27, 2017

(54) POWER METER WITH AUTOMATIC CONFIGURATION

(71) Applicant: Veris Industries, LLC, Tualatin, OR (US)

(72) Inventors: Martin Cook, Tigard, OR (US); Michael Bitsch, Hillsboro, OR (US)

(73) Assignee: Veris Industries, LLC, Tualatin, OR (US)

( * ) Notice: Subject to any disclaimer, the term of this patent is extended or adjusted under 35 U.S.C. 154(b) by 0 days.

(21) Appl. No.: 14/946,095

(22) Filed: Nov. 19, 2015

(65) Prior Publication Data

US 2016/0069933 A1 Mar. 10, 2016

Related U.S. Application Data

(63) Continuation of application No. 14/050,496, filed on Oct. 10, 2013.

(60) Provisional application No. 61/747,937, filed on Dec. 31, 2012.

(51) Int. Cl.
| | |
|---|---|
| *G01R 15/18* | (2006.01) |
| *G01R 15/14* | (2006.01) |
| *G01R 21/133* | (2006.01) |
| *G01R 19/00* | (2006.01) |
| *G01R 21/00* | (2006.01) |
| *H02J 1/00* | (2006.01) |
| *G01R 1/00* | (2006.01) |
| *G05F 1/00* | (2006.01) |
| *G01K 1/00* | (2006.01) |

(52) U.S. Cl.
CPC ........... *G01R 15/142* (2013.01); *G01R 15/18* (2013.01); *G01R 19/0092* (2013.01); *G01R 21/00* (2013.01); *G01R 21/133* (2013.01); *G01K 1/00* (2013.01); *G01K 2201/00* (2013.01); *G01R 1/00* (2013.01); *G05F 1/00* (2013.01); *H02J 1/00* (2013.01)

(58) Field of Classification Search
CPC ......... G01R 1/00; G01K 1/00; G01K 2201/00
See application file for complete search history.

(56) References Cited

U.S. PATENT DOCUMENTS

| | | |
|---|---|---|
| 3,500,194 A | 3/1970 | Smith |
| 4,110,807 A | 8/1978 | Neuhouser |
| 4,418,269 A | 11/1983 | Eaton-Williams |
| 4,492,918 A | 1/1985 | Hernandez et al. |

(Continued)

*Primary Examiner* — Jermele M Hollington
*Assistant Examiner* — Temilade Rhodes-Vivour
(74) *Attorney, Agent, or Firm* — Chernoff Vilhauer McClung & Stenzel, LLP

(57) ABSTRACT

A power monitoring system includes a plurality of current sensors suitable to sense respective changing electrical current within a respective conductor to a respective load and a conductor sensing a respective voltage potential provided to the respective load. A power monitors determines a type of circuit based upon a signal from at least one of the current sensors and a signal from the conductor, wherein the type of circuit includes at least one of a single phase circuit, a two phase circuit, and a three phase circuit. The power meter configures a set of registers corresponding to the determined type of circuit in a manner such that the configuring is different based upon each of the single phase circuit, two phase circuit, and three phase circuit suitable to provide data corresponding to the determined type of circuit.

2 Claims, 7 Drawing Sheets

(56) References Cited

U.S. PATENT DOCUMENTS

| | | | |
|---|---|---|---|
| 4,558,310 A | 12/1985 | McAllise | |
| 4,636,720 A | 1/1987 | Farr | |
| 4,785,406 A | 11/1988 | Lunderius et al. | |
| 5,122,735 A | 6/1992 | Porter et al. | |
| 5,337,206 A | 8/1994 | Kadah et al. | |
| 5,390,067 A | 2/1995 | Eriksson et al. | |
| 5,471,359 A | 11/1995 | Simpson et al. | |
| 5,475,558 A | 12/1995 | Barjonnet et al. | |
| 5,548,527 A | 8/1996 | Hemminger et al. | |
| 5,644,206 A | 7/1997 | Yura | |
| 5,708,364 A | 1/1998 | Vokey et al. | |
| 5,736,847 A | 4/1998 | Van Doorn et al. | |
| 5,825,173 A | 10/1998 | Lim | |
| 5,861,683 A | 1/1999 | Engel et al. | |
| 5,869,916 A | 2/1999 | Suzuki et al. | |
| 5,982,596 A | 11/1999 | Spencer et al. | |
| 6,041,287 A * | 3/2000 | Dister | B60L 3/0023 702/182 |
| 6,157,527 A | 12/2000 | Spencer et al. | |
| 6,175,810 B1 | 1/2001 | Jurisch | |
| 6,289,267 B1 | 9/2001 | Alexander et al. | |
| 6,292,717 B1 | 9/2001 | Alexander et al. | |
| 6,330,516 B1 | 12/2001 | Kammeter | |
| 6,737,854 B2 | 5/2004 | Bruno et al. | |
| 6,809,509 B2 | 10/2004 | Bruno et al. | |
| 6,937,003 B2 | 8/2005 | Bowman et al. | |
| 7,157,899 B2 | 1/2007 | Bruno | |
| 7,161,345 B2 | 1/2007 | Bruno | |
| 7,221,145 B2 | 5/2007 | Bowman et al. | |
| 7,230,414 B2 | 6/2007 | Bruno | |
| 7,330,022 B2 | 2/2008 | Bowman et al. | |
| 7,359,809 B2 | 4/2008 | Bruno | |
| 7,447,603 B2 | 11/2008 | Bruno | |
| 7,453,267 B2 | 11/2008 | Westbrock, Jr. et al. | |
| 7,474,088 B2 | 1/2009 | Bowman et al. | |
| 7,493,222 B2 | 2/2009 | Bruno | |
| 7,526,393 B2 | 4/2009 | Thurmond et al. | |
| 7,660,776 B1 | 2/2010 | Kious | |
| 7,855,655 B2 | 12/2010 | Hunter et al. | |
| 7,902,992 B2 | 3/2011 | Hunter | |
| 8,081,003 B2 | 12/2011 | Pacha et al. | |
| 8,610,438 B1 * | 12/2013 | Sykora | G01R 15/183 307/64 |
| 2003/0102968 A1 | 6/2003 | Bruno et al. | |
| 2003/0141874 A1 | 7/2003 | Weinmann | |
| 2003/0169029 A1 | 9/2003 | Piesinger | |
| 2003/0184279 A1 | 10/2003 | Bruno et al. | |
| 2004/0027748 A1 * | 2/2004 | Kojovic | H02H 7/0455 361/62 |
| 2005/0093376 A1 | 5/2005 | Cleveland | |
| 2006/0238932 A1 * | 10/2006 | Westbrock, Jr. | H02H 1/0038 361/42 |
| 2007/0010916 A1 | 1/2007 | Rodgers et al. | |
| 2008/0079437 A1 * | 4/2008 | Robarge | G01R 15/146 324/522 |
| 2009/0322314 A1 | 12/2009 | Long et al. | |
| 2010/0084920 A1 * | 4/2010 | Banting | G01R 15/142 307/66 |
| 2010/0091529 A1 | 4/2010 | Jakeman et al. | |
| 2010/0264944 A1 * | 10/2010 | Rupert | G01R 11/02 324/706 |
| 2010/0308792 A1 * | 12/2010 | Rupert | G01R 21/133 324/76.77 |
| 2012/0078680 A1 * | 3/2012 | Tharp | G06Q 10/0635 705/7.28 |
| 2012/0221278 A1 * | 8/2012 | Cook | G01R 21/133 702/107 |

* cited by examiner

| Address | Typical Offset | Units | Description | Integer: multiplier required | Float: upper 16 bits | Float: lower 16 bits |
|---|---|---|---|---|---|---|
| 40263 | 4 | VAR | Reactive Power | | x | |
| 40264 | | VAR | Reactive Power | | | x |
| 40265 | 6 | VA | Apparent Power | | x | |
| 40266 | | VA | Apparent Power | | | x |
| 40267 | 8 | --- | Power Factor | | x | |
| 40268 | | --- | Power Factor | | | x |
| 40269 | 10 | VOLTS | Voltage, line to line | | x | |
| 40270 | | VOLTS | Voltage, line to line | | | x |
| 40271 | 12 | VOLTS | Voltage, line to neutral | | x | |
| 40272 | | VOLTS | Voltage, line to neutral | | | x |
| 40273 | 14 | AMPS | Current | | x | |
| 40274 | | AMPS | Current | | | x |
| 40275 | 16 | KW | Real Power, phase A | | x | |
| 40276 | | KW | Real Power, phase A | | | x |
| 40277 | 18 | KW | Real Power, phase B | | x | |
| 40278 | | KW | Real Power, phase B | | | x |
| 40279 | 20 | KW | Real Power, phase C | | x | |
| 40280 | | KW | Real Power, phase C | | | x |
| 40281 | 22 | --- | Power Factor, phase A | | x | |
| 40282 | | --- | Power Factor, phase A | | | x |
| 40283 | 24 | --- | Power Factor, phase B | | x | |
| 40284 | | --- | Power Factor, phase B | | | x |
| 40285 | 26 | --- | Power Factor, phase C | | x | |
| 40286 | | --- | Power Factor, phase C | | | x |
| 40287 | 28 | VOLTS | Voltage, phase A-B | | x | |
| 40288 | | VOLTS | Voltage, phase A-B | | | x |
| 40289 | 30 | VOLTS | Voltage, phase B-C | | x | |
| 40290 | | VOLTS | Voltage, phase B-C | | | x |
| 40291 | 32 | VOLTS | Voltage, phase A-C | | x | |
| 40292 | | VOLTS | Voltage, phase A-C | | | x |
| 40293 | 34 | VOLTS | Voltage, phase A-N | | x | |
| 40294 | | VOLTS | Voltage, phase A-N | | | x |
| 40295 | 36 | VOLTS | Voltage, phase B-N | | x | |
| 40296 | | VOLTS | Voltage, phase B-N | | | x |
| 40297 | 38 | VOLTS | Voltage, phase C-N | | x | |
| 40298 | | VOLTS | Voltage, phase C-N | | | x |
| 40299 | 40 | AMPS | Current, phase A | | x | |
| 40300 | | AMPS | Current, phase A | | | x |
| 40301 | 42 | AMPS | Current, phase B | | x | |
| 40302 | | AMPS | Current, phase B | | | x |
| 40303 | 44 | AMPS | Current, phase C | | x | |
| 40304 | | AMPS | Current, phase C | | | x |
| 40305 | 46 | KW | Average Real Power | | x | |
| 40306 | | KW | Average Real Power | | | x |
| 40307 | 48 | KW | Minimum Real Power | | x | |
| 40308 | | KW | Minimum Real Power | | | x |
| 40309 | 50 | KW | Maximum Real Power | | x | |
| 40310 | | KW | Maximum Real Power | | | x |

FIG. 3B

| Address | Typical Offset | Units | Description | Integer: multiplier required | Float: upper 16 bits | Float: lower 16 bits |
|---|---|---|---|---|---|---|
| 40001 | 0 | KWH | Energy Consumption LSW | x | | |
| 40002 | 1 | KWH | Energy Consumption MSW | x | | |
| 40003 | 2 | KW | Real Power | x | | |
| 40004 | 3 | VAR | Reactive Power | x | | |
| 40005 | 4 | VA | Apparent Power | x | | |
| 40006 | 5 | --- | Power Factor | x | | |
| 40007 | 6 | KW | Real Power, phase A | x | | |
| 40008 | 7 | | Power Factor, phase A | x | | |
| 40009 | 8 | AMPS | Current, Phase A | x | | |
| 40010 | 9 | KW | Average Real Power | x | | |
| 40011 | 10 | KW | Minimum Real Power | x | | |
| 40012 | 11 | KW | Maximum Real Power | x | | |
| 40013 | 12 | | • | | | |
| 40014 | 13 | | • | | | |
| 40015 | 14 | | • | | | |
| 40016 | 15 | | | | | |
| 40017 | 16 | | | | | |
| 40018 | 17 | | | | | |
| 40019 | 18 | | | | | |
| 40020 | 19 | | | | | |
| 40021 | 20 | | | | | |
| 40022 | 21 | | | | | |
| 40023 | 22 | | | | | |
| 40024 | 23 | | | | | |
| 40025 | 24 | | | | | |
| 40026 | 25 | | | | | |
| 40027 | 26 | | | | | |

FIG. 4

| Address | Typical Offset | Units | Description | Integer: multiplier required | Float: upper 16 bits | Float: lower 16 bits |
|---|---|---|---|---|---|---|
| 40001 | 0 | KWH | Energy Consumption LSW | x | | |
| 40002 | 1 | KWH | Energy Consumption MSW | x | | |
| 40003 | 2 | KW | Real Power | x | | |
| 40004 | 3 | VAR | Reactive Power | x | | |
| 40005 | 4 | VA | Apparent Power | x | | |
| 40006 | 5 | --- | Power Factor | x | | |
| 40007 | 6 | KW | Real Power, phase A | x | | |
| 40008 | 7 | | Power Factor, phase A | x | | |
| 40009 | 8 | AMPS | Current, Phase A | x | | |
| 40010 | 9 | KW | Average Real Power | x | | |
| 40011 | 10 | KW | Minimum Real Power | x | | |
| 40012 | 11 | KW | Maximum Real Power | x | | |
| 40013 | 12 | KW | Real Power, phase B | | | |
| 40014 | 13 | | Power Factor, Phase B | | | |
| 40015 | 14 | VOLTS | Voltage Phase A-B | | | |
| 40016 | 15 | VOLTS | Voltage Phase A-N | | | |
| 40017 | 16 | KW | Current, Phase B | | | |
| 40018 | 17 | | ● | | | |
| 40019 | 18 | | ● | | | |
| 40020 | 19 | | ● | | | |
| 40021 | 20 | | | | | |
| 40022 | 21 | | | | | |
| 40023 | 22 | | | | | |
| 40024 | 23 | | | | | |
| 40025 | 24 | | | | | |
| 40026 | 25 | | | | | |
| 40027 | 26 | | | | | |

FIG. 5

| Address | Typical Offset | Units | Description | Integer: multiplier required | Float: upper 16 bits | Float: lower 16 bits |
|---|---|---|---|---|---|---|
| 40001 | 0 | KWH | Energy Consumption LSW | x | | |
| 40002 | 1 | KWH | Energy Consumption MSW | x | | |
| 40003 | 2 | KW | Real Power | x | | |
| 40004 | 3 | VAR | Reactive Power | x | | |
| 40005 | 4 | VA | Apparent Power | x | | |
| 40006 | 5 | ---- | Power Factor | x | | |
| 40007 | 6 | KW | Real Power, phase A | x | | |
| 40008 | 7 | | Power Factor, phase A | x | | |
| 40009 | 8 | AMPS | Current, Phase A | x | | |
| 40010 | 9 | KW | Average Real Power | x | | |
| 40011 | 10 | KW | Minimum Real Power | x | | |
| 40012 | 11 | KW | Maximum Real Power | x | | |
| 40013 | 12 | KW | Real Power, phase B | x | | |
| 40014 | 13 | | Power Factor, Phase B | x | | |
| 40015 | 14 | VOLTS | Voltage Phase A-B | x | | |
| 40016 | 15 | VOLTS | Voltage Phase B-C | x | | |
| 40017 | 16 | VOLTS | Voltage Phase A-C | x | | |
| 40018 | 17 | VOLTS | Voltage Phase A-N | x | | |
| 40019 | 18 | VOLTS | Voltage Phase B-N | x | | |
| 40020 | 19 | VOLTS | Voltage Phase C-N | x | | |
| 40021 | 20 | AMPS | Current, Phase C | x | | |
| 40022 | 21 | | ● | | | |
| 40023 | 22 | | ● | | | |
| 40024 | 23 | | ● | | | |
| 40025 | 24 | | | | | |
| 40026 | 25 | | | | | |
| 40027 | 26 | | | | | |

FIG. 6

POWER METER WITH AUTOMATIC CONFIGURATION

CROSS-REFERENCE TO RELATED APPLICATIONS

This application is a continuation of U.S. patent application Ser. No. 14/050,496, filed Oct. 10, 2013, which application claims the benefit of U.S. Provisional App. No. 61/747,937, filed Dec. 31, 2012.

BACKGROUND OF THE INVENTION

The present invention relates generally to a power meter with automatic configuration capability.

Electrical power is provided to many devices, such as large motors, by three separate cables, each of which supplies a single phase of three phase-power. In an ideal system, each of the phases within the respective cable has a phase angle which is generally 120 degrees apart from the other phases. Accordingly, the total power flowing through the three cables to a three-phase load (or from a three-phase generator) may be computed based upon the phase adjusted voltages and the phase adjusted currents.

A sub-metering system generally includes a separate transformer installed on each respective cable of the three cables of a three-phase system within a customer's power box containing the electrical panel. Each transformer senses a changing current within a respective cable and produces an output voltage or current proportional to the changing current. A measuring circuit is electrically connected to the three transformers and receives each of the transformer output voltages or currents. The measuring circuit is also electrically connected to the three cables by voltage "taps" to measure the voltage therein. The voltage "tap" measurements are preferably obtained by an electrical connection to the interface between each phase of the respective cable and the panel. The measuring circuit calculates the power usage of the respective three phases using the output voltages from the transformers and the voltages sensed by the three voltage "taps."

Flexibility has favored adoption of digital current and power meters, known as branch circuit monitors, incorporating data processing systems typically comprising one or more microprocessors or digital signal processors (DSP) that periodically read the output of each of the voltage and current transducers, calculate the current or voltage at the respective transducer and display or store the results. In addition, the data processing unit periodically may calculate the power and other electrical parameters, such as active power, apparent power and reactive power that quantify electricity distribution and consumption. The calculated parameters are typically output to a display for immediate viewing and/or transmitted from a communications interface to another data processing system, such as a building management computer for remote display or further processing, for example formulating instructions to automated building equipment.

Branch circuit monitors are commonly incorporated in networks that utilize the MODBUS® RTU serial communication protocol. The MODBUS protocol, first published in 1979, enables serial communication between up to 247 interconnected network devices and has become a de facto standard communications protocol for connecting industrial electronic devices. Each device is given a unique address and each query contains the address of the intended device. A device will not respond to a query unless it contains that device's address. A basic MODBUS query can control or read an input/output port of a receiving device or instruct the receiving device to change or send back one or more values contained in its memory.

While the MODBUS protocol is a de facto standard for industrial electronic devices, it does have its limitations. For example, since MODBUS was developed in the 1970s to communicate with programmable logic controllers (PLCs), the number of supported data types is limited to those utilized by PLCs at that time and does not include large binary objects. Also, the number of addressable registers in a MODBUS device is limited which can affect the device's performance and utility. For example, a branch circuit monitor monitoring a large number of circuits and determining several electrical measurement parameters for each circuit generates substantial amounts of data and the limited number of addressable registers can limit the number of circuits monitored by the branch circuit monitor and/or the types of data that can be produced and communicated by the monitor. Also, the configuration of such a device can be cumbersome and require significant computational resources to determine all the potential data that may be desired.

What is desired therefore is a power meter that is computationally efficient.

The foregoing and other objectives, features, and advantages of the invention may be more readily understood upon consideration of the following detailed description of the invention, taken in conjunction with the accompanying drawings.

BRIEF DESCRIPTION OF THE SEVERAL VIEWS OF THE DRAWINGS

FIGS. 3A and 3B illustrate an exemplary MODBUS point map.

FIG. 4 illustrates a portion of an exemplary single phase MODBUS point map.

FIG. 5 illustrates a portion of an exemplary two-phase MODBUS point map.

FIG. 6 illustrates a portion of an exemplary three-phase MODBUS point map.

DETAILED DESCRIPTION OF PREFERRED EMBODIMENT

Figure 1:
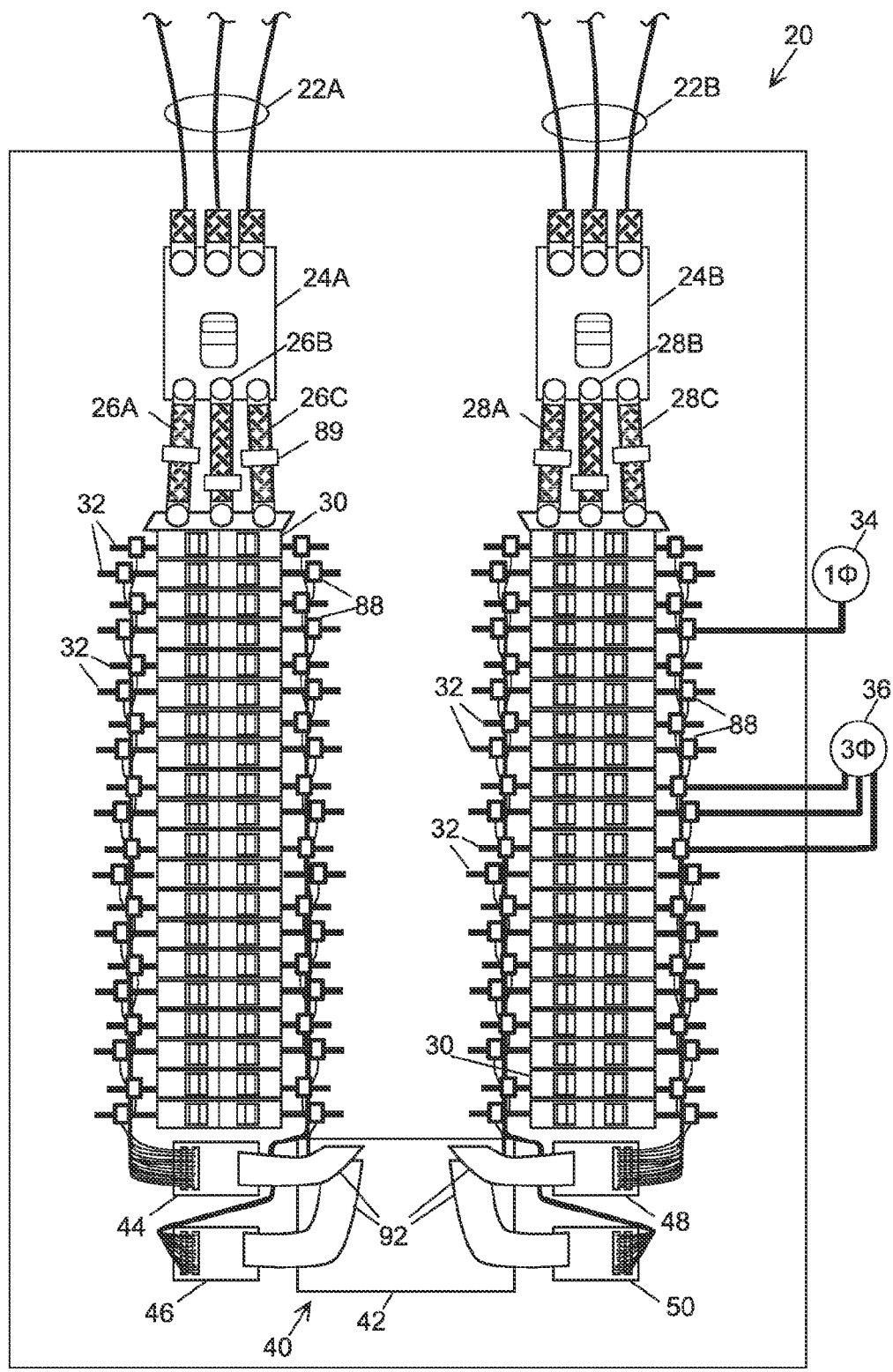
FIG. 1 illustrates an exemplary power meter system.

Electricity delivered by the local utility to a facility's mains is distributed to the various loads in the facility by branch circuits which are conductively connected to the mains at a distribution panel. Referring in detail to the drawings where similar parts are identified by like reference numerals, and, more particularly to FIG. 1, an exemplary distribution panel 20 includes two three-phase mains 22A, 22B which are respectively connected to main circuit breakers 24A, 24B. Each of the phases of each main is connected to a respective bus bar 26A, 26B, 26C and 28A, 28B, 28C. Three of the bus bars extend behind each of two rows of branch circuit breakers 30 that respectively conductively connect one of the bus bars to a branch circuit conductor 32 which is conductively connected to the load(s) of the branch circuit. A single phase load, for example, load 34, is conductively connected to a single bus bar. A two-phase load is connected, typically through two adjacent circuit breakers in the same row, to two bus bars conducting different phases of the power. A three-phase load, for example, load 36, is connected, typically through three adjacent circuit breakers in the same row, to three bus bars each conducting a different phase of the electricity.

A digital branch circuit monitor 40 is often installed in an electrical distribution panel, such as the exemplary distribution panel 20, to monitor the current or the current and the voltage in the circuits served by the panel. For example, a digital branch circuit monitor produced by Veris Industries, Inc. can monitor the current or the power (current and voltage) in up to 84 branch circuits and two three-phase mains of a power distribution panel and can determine, in addition to voltage and current, a number of other parameters related to energy consumption for each circuit served by the distribution panel. Data updates occur approximately every two seconds and an alarm may be triggered by the monitor if the operation of a circuit approaches a user configured threshold. The exemplary branch circuit monitor 40 comprises a main acquisition board 42 and four adapter boards 44, 46, 48, 50 facilitating interconnection of the measuring circuitry and the transducers which sense current and voltage in the various conductors of the distribution panel.

Figure 2:
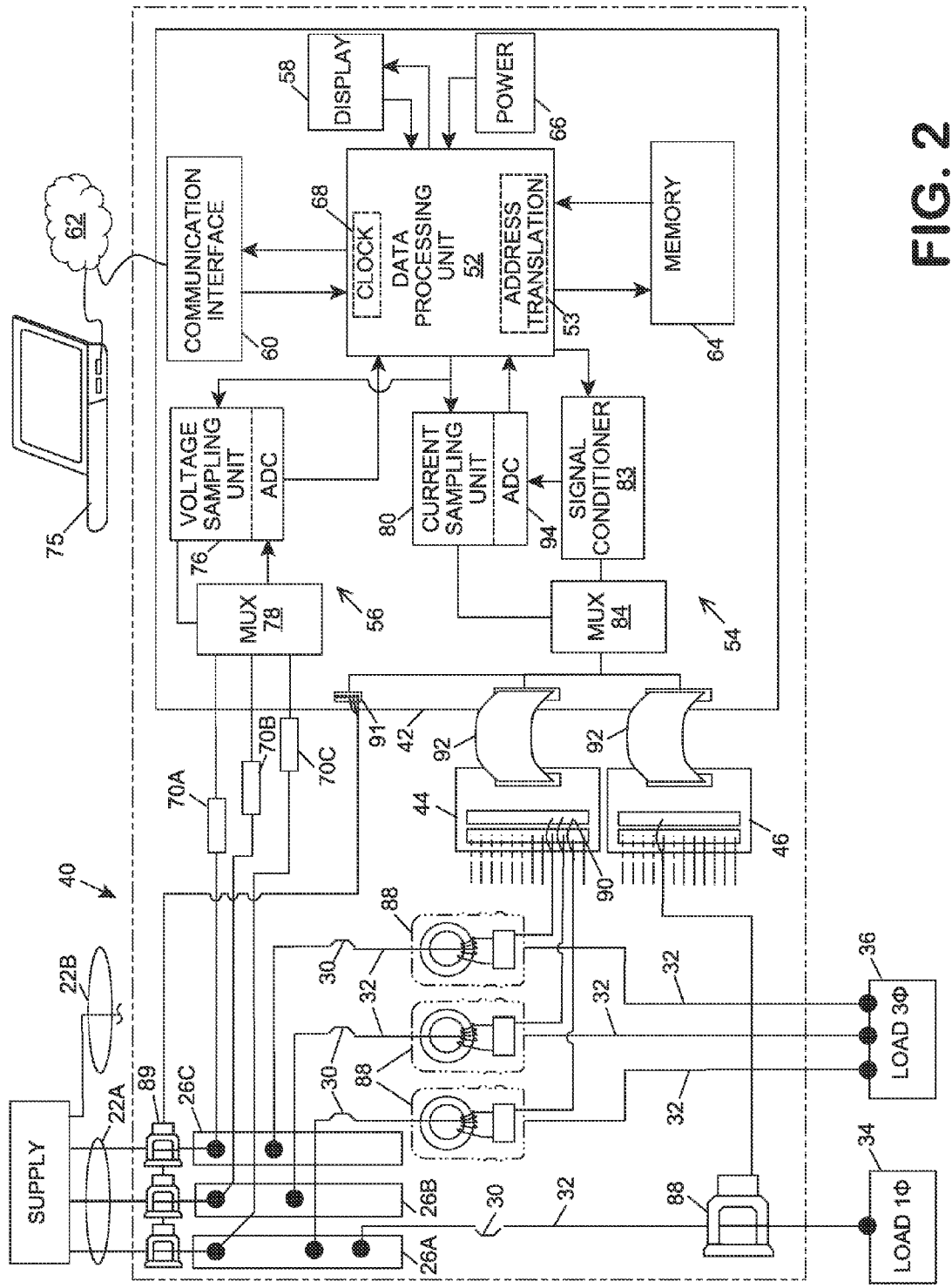
FIG. 2 illustrates an exemplary power meter board.

Referring also to FIG. 2, the exemplary digital branch circuit monitor 40 is arranged to monitor the both voltage and current in a plurality of branch circuits and comprises, generally, a data processing unit 52, a current measuring section 54 and a voltage measuring section 56. The data processing unit 52 typically comprises at least one microprocessor or digital signal processor (DSP). The data processing unit 52 periodically reads and stores data from the voltage 56 and the current 54 measuring sections, and uses that data to calculate the current, voltage, power and other electrical parameters that are the meter's output. The calculated values may be output to a display 58 for viewing at the meter or output to a communications interface 60 for transmission via a communication network 62 to another data processing system 75, such as a building management computer, for remote display or use in automating or managing the facility's operations. A memory 64 in which the software for the data processing unit and data manipulated by the data processing unit may be stored is associated with the data processing unit. A power supply 66 provides power to the data processing unit and to the voltage and current measuring sections. One or more clocks 68, which may be incorporated into the data processing unit, time intervals between the occurrences of monitored events.

The voltage measuring section 56 includes one or more voltage transducers 70A, 70B, 70C each typically comprising a resistor network, a voltage sampling unit 76 to sample the output of the voltage transducers and convert the analog measurements to digital data suitable for use by the data processing unit and a multiplexer 78 that periodically connects the voltage sampling unit to a selected one of the voltage transducers enabling periodic sampling of the magnitude of the voltage at each voltage transducer. Typically, each phase of the electricity supplied to a distribution panel is connected to a bus bar, for example, bus bars 26A, 26B, 26C, and each branch circuit breaker 30 connectively interconnects one of the bus bars to a branch circuit conductor 32. One or more of the branch circuit conductors are conductively connected to each of the facility's loads, for examples, loads 34, 36. Since the voltage and phase supplied to all commonly connected loads is the same, a meter for measuring three-phase power typically includes at least three voltage transducers 70A, 70B, 70C each connected to one of the bus bars 26A, 26B, 26C that is conducting a different phase of the power from one of the mains, for example, main 22A.

The current measuring section 54 comprises a current sampling unit 80, a multiplexer 84, a signal conditioning unit 83 and a plurality of current transducers each representing data channel in the branch circuit monitor. The current transducers are preferably current transformers but other types of current sensors might be used. Current monitoring with a current transformer uses a current transformer for each of the conductors in which the current is to be monitored. In the exemplary branch circuit monitor 40 a current transformer 89 senses the current in each of the panel's mains and a branch current transducer 88 senses the current in each of the panel's branch circuit conductors 32.

The auxiliary current transformers 89 monitoring the current in the mains are connected to a terminal block 91 on the main circuit board. Each terminal of the terminal block 91 is conductively connected to the multiplexer 84. For convenience, each of the branch current transducers 88 may be respectively connected to a sensor position 90 on one of the adapter boards, 44, 46, 48, 50. A multi-conductor cable 92 communicatively connects each of the sensor positions of each of the adapter boards to the multiplexer 84 on the main circuit board 42. The multiplexer 84 is connected to a signal conditioning unit 83 which is, in turn, conductively connected to an analog-to-digital converter 94 of the current sampling unit 80. In response to a timing signal from the clock 68, the multiplexer sequentially connects each sensor position and each terminal block connection to the signal conditioning unit and, thereby, the analog-to-digital converter which outputs to the data processing unit 52 a digital signal representing a sample output of the respective current transducer.

Instantaneous values of the sinusoidal analog voltage and current waveforms are digitally captured by periodically, sampling the amplitudes of the outputs of respective voltage and current transducers. The data processing unit calculates the current in the power cable monitored by a current transducer from the characteristics of the transducer and a plurality of sample outputs of the transducer accumulated over a period of time. The "effective," "real" or "active" power is approximated by averaging the sum of the products of temporally corresponding instantaneous samples of the voltage and current for each of the plurality of sampling intervals, such as, at least one cycle of the sinusoidal waveform:

Users of branch circuit monitors are often interested in a number of parameters related to electricity distribution in addition to the voltage, current and effective power for the facility and each of its branch circuits. For example, the reactive power, the portion of the total power that is temporarily stored in the form of electric and magnetic fields due to inductive and capacitive elements in a circuit, influences the voltage levels in a transmission network and are controlled along with the voltage to allow an electrical power system to be operated within acceptable limits. The power factor of an alternating current (AC) circuit is the ratio of real power, the capacity of a circuit to do work, flowing to the load and the apparent power, the product of the voltage and current in the circuit. Non-linear loads such as rectifiers; arc discharge devices, such as fluorescent lighting or electric welders, and switched-mode power supplies reduce the power factor and increase the number volt-amperes that must be supplied for a given amount of work. Many users desire that the data processing unit of the branch circuit monitor compute a number of these electrical parameters in addition to determining the voltage, current and effective power and transmit this information to other networked data processing devices utilizing the MODBUS® communication protocol.

The MODBUS communication protocol was developed and published in 1979 for use with Modicon® programmable logic controllers (PLCs). MODBUS is an open serial communication protocol and has become a standard communication protocol for connecting industrial electronic devices. The MODBUS protocol is commonly used to transmit signals from control devices and instrumentation, such as a branch circuit monitor, to a main controller and/or a data aggregating system. The device requesting information or writing information is called the MODBUS master and the devices supplying or reading the information are known as MODBUS slaves. In a standard MODBUS network there is at least one master and up to 247 slaves, each with a unique address. Masters can broadcast a message, known as a query, to all slaves or it can address a query to an individual slave. When the master requests or writes data to a slave, the first byte of the message is the address of the intended slave. A slave only responds to queries containing its address and does not respond to queries directed to other addressees or to broadcast queries.

Figure 3A:

In a MODBUS slave device, information is stored in four tables, each having 9999 entries. Two tables, one a read-only table and one a write only table, store discrete on/off values, referred to as "coils." Similarly, a read-only table and a write-only table store numerical values in data spaces known as "registers." Referring to FIGS. 3A and 3B, a MODBUS point map 100 for a standard MODBUS slave device lists the register numbers 102 and a description 104 of the data stored in the respective registers. In addition, the point map may list the data type and the source of the data, in the case of a branch circuit monitor, the channel or meter number corresponding to a particular circuit monitored by the meter.

Some MODBUS devices can utilize extended register addressing to increase the addressable memory of the device. The output registers of a standard MODBUS device have addresses ranging from 0000 to 270E (hexadecimal), but up to 65,500 registers can be addressed by extending register addressing with addresses from 207F to FFFF. However, all devices in a MODBUS network must utilize the same register addressing and many software drivers for MODBUS master computers and many slave devices do not support extended register addressing. Many MODBUS devices use a MODBUS point map which lists the address assigned to each data point. For example, registers are read with the most significant byte (MSB) first with 32 bit floating point values encoded per IEEE Standard 754. For floating point format variables, each data point appears twice because two 16-bit addresses are used to hold a 32 bit float value. The 16 bit most significant word (MSW) may be in the lower address of the register pair, while the list significant word (LSW) may be in the upper address. It is to be understood that other protocols and techniques other than MODBUS may be used, if desired. For example, N2 and LonWorks may be used.

For a particular power meter, there are numerous registers that are programmed by the power meter, and thus require selection of which registers to use together with what parameter values to store in those registers, and computational resources to regularly compute and update the values for such registers. For example, a power meter may compute (1) the energy consumption least significant word and most significant word; (2) the real power consumed; (3) the reactive power consumed; (4) the apparent power; (5) the power factor; (6) the voltage line to line; (7) voltage line to neutral; (8) the current; (9) real power on phase A; (10) real power on phase B; (11) real power on phase C; (12) power factor on phase A; (13) power factor on phase B; (14) power factor on phase C; (15) voltage phase A-B; (16) voltage phase B-C; (17) voltage phase A-C; (18) voltage phase A-N; (19) voltage phase B-N; (20) voltage phase C-N; (21) current phase A; (22) current phase B; (23) current phase C; (24) average real power; (25) minimum real power; (26) maximum real power; (27) energy consumption for the least and most significant word; (28) real power for the least and most significant word; (29) the reactive power consumed for the least and most significant word; (30) the apparent power for the least and most significant word; (31) the power factor for the least and most significant word; (32) the voltage line to line for the least and most significant word; (33) voltage line to neutral for the least and most significant word; (34) the current for the least and most significant word; (35) real power on phase A for the least and most significant word; (36) real power on phase B for the least and most significant word; (37) real power on phase C for the least and most significant word; (38) power factor on phase A for the least and most significant word; (39) power factor on phase B for the least and most significant word; (40) power factor on phase C for the least and most significant word; (41) voltage phase A-B for the least and most significant word; (42) voltage phase B-C for the least and most significant word; (43) voltage phase A-C for the least and most significant word; (44) voltage phase A-N for the least and most significant word; (45) voltage phase B-N for the least and most significant word; (46) voltage phase C-N for the least and most significant word; (47) current phase A for the least and most significant word; (48) current phase B for the least and most significant word; (49) current phase C for the least and most significant word; (50) average real power for the least and most significant word; (51) minimum real power for the least and most significant word; and (52) maximum real power for the least and most significant word. In many cases, a single command may be used to read all of the data available from the power meter. Other electrical parameters may likewise be determined. Also, parameters may be determined for single and dual phase circuits. The selection of the registers and the values therein becomes even more complicated when there are many three phase power circuits interconnected within the same power meter using the same MODBUS set of registers. Further, the selection of registers becomes even more complicated and computationally demanding when there are one or more single phase power circuits, one or more two phase power circuits, and/or one or more three phase power circuits within the same panel or configuration using the MODBUS registers of the single slave device. The programming of the power meter for this multitude of potential configurations is a time consuming task. Furthermore, the likelihood that particular current transformers are improperly interconnected with different phases or to the wrong load is highly likely, making it difficult to trouble shoot the system to determine the actual configuration, so that accurate data may be obtained.

The present inventor considered the limitations presented by the number of potentially different configurations, the difficulty in determining the number of phases of a circuit and/or the phase orientations, together with the potential amount of data that would be provided over the MODBUS upon a request for all of the available data, and determined that a system that automatically configures the phase relationships together with determining the appropriate registers to include and to calculate data for would be desirable.

Moreover, upon a request for all of the available data, only the relevant data should be provided rather than data that is not appropriate nor has any particular meaning for the particular configuration. For example, for a two phase circuit it is undesirable to provide three phase data since the third phase is not part of the circuit. In this manner the three phase data would not be included in the MODBUS registers and thus not provided upon such a request.

During normal installation the sensors, e.g., current transformers, are initially affixed within the power panel in an adjacent spaced apart relationship with respect to a set of circuit breakers. A support may be located on both sides of the set of circuit breakers that support the sensors, if desired. Then, the wires from the loads are passed through the respective sensors and interconnected to a respective circuit breaker. In addition, the wires for sensing the voltage potentials on the bus bars are likewise electrically interconnected. In this manner, the installation of the circuit breakers and the power monitor is efficient, less expensive, economical, and the sensors are in a suitable position with respect to the respective circuit breakers The support may be suitable for supporting a set of electrical traces that interconnect the sensors to a connector. The interconnection from the sensors to the connector may be predetermined so that the signals provided to the connector are readily identifiable to the proper sensor. This eliminates the potential possibility of improperly interconnecting the wires from the sensors to the connector. A cable interconnects each connector to a power monitor. While such a set of supports with respective sensors are suitable for use with new installation, it is difficult to install such a set of sensors to an existing set of circuit breakers with wires already installed. To permit the sensors to be readily interconnected with wires already interconnected to the circuit breakers the sensors may be constructed in a split-core manner. In this manner, the opening may be opened, the wire inserted therein, and the opening closed around substantially all of the wire. In some cases, the current sensors may be interconnected to the power monitor each with a respective flexible wire with or without split core sensors.

Traditionally, the electrical installer is required to identify the phase of the bus bars of the power panel, such as phase A, phase B, and phase C to properly interconnect the wires of phase A, phase B, and phase C, to the appropriate bus bar and connection on the power monitor. In addition, the electrical installer is required to identify the phase, such as phase A, phase B, and phase C, of each circuit breaker, or phase a multi-phase circuit breaker. With each circuit breaker's phase identified, then the electrical installer is required to properly interconnect each respective current sensor to the appropriate interconnection on the power monitor.

The proper installation of a power monitoring system is problematic because the phase of each of the bus bars are normally not identified in a consistent manner, especially when the phase of each bus bar depends upon its interconnection to the power service from the utility. Similarly, the phase of each of the circuit breakers of a multi-phase circuit breaker are not necessarily identified in a consistent manner. Further, the phase of each single phase circuit breaker depends upon its interconnection to one or more of the bus bars, which may be difficult to identify because the interconnection is typically underneath an installed circuit breaker. To further complicate matters, the phase of the current within each of the current sensors depends upon which wire the current sensor is associated with. Also, it may be difficult to identify two phase circuits. Also, single phase circuits may be improperly included as part of a multi-phase circuit. Accordingly, the electrical installer needs to determine the phase of the bus bar, determine the phase of the associated circuit breaker, identify the wire interconnected with the circuit breaker, associate a particular current sensor with the interconnected wire, and interconnect the current sensor to the appropriate location of the power monitor. The likelihood of an electrical installer properly identifying all of these relationships is unlikely, especially the phase relationships between different phases for a particular multi-phase load. The multi-phase circuits may be two or more phases.

To verify or otherwise determine which phases from the current sensors are associated with which voltage from the bus bars, may involve the power meter assuming a unity power factor and matching those with the closest phase relationship. This may be performed in an automated manner so that the single phase, two phase, and/or three phase circuits may be identified and the phase relationship between the phases, if desired. For example, the rising edge of the waveforms may be used to identify a consistent point in each cycle of the signal for each phase. The identified cycles are then matched together to determine the likely arrangement of single, two, and three phase circuits and the relationship of phases therein, if desired.

Also the power distribution system itself may be utilized to identify the appropriate matching between the voltage sensing and current sensing. In particular, the power meter may superimpose a signal on one or more of the bus bars (i.e., the power signals to one or more loads normally of 60 hertz, 120 volt, three phases) and sensed within one or more of the wires to the loads. Alternatively, a signal may be superimposed on one or more of the wires to the loads and sensed within one or more of the bus bars (i.e., the power signals to one or more loads normally of 60 hertz, 120 volt, three phases). In any event, the configuration of the system may be automatically determined. If desired, the installer may review and modify the resulting auto determined configuration of single, two, and/or three phase circuits, and the phase relationships, if desired.

When the MODBUS master queries the branch circuit monitor for data in one of the registers, it sends a query to the data processing unit specifying the desired data. If for example, the MODBUS master is requesting that the branch circuit monitor report the value of the power in channel 2, the master sends a query to the branch circuit monitor directing the data processing unit to access the data contained in the appropriate data space and provide the data in a MODBUS based response.

By way of example, if the power meter determines that two adjacent circuits are 180 degrees out of phase then the power meter may assign these two phases to be part of a 2-phase system. The two phase system may be a residential split phase system, having 3 wire single phase distribution with two live conductors (i.e. 3 wire, single phase, midpoint neutral system). By way of example, if the power meter determines that two or more adjacent circuits are the same phase then the power meter may assign these two or more adjacent circuits as each of a single phase system. Also, circuits that are not otherwise assigned to multi-phase circuits may be assigned as each being part of a single phase system. By way of example, if the power meter determines that three adjacent circuits are generally 120 degrees out of phase then the power system may assign these three as part of a 3 phase system The system may also determine the order of the phases A, B, and C among the three phases. In addition, the system may determine and assign two and three phase circuits to non-adjacent current sensors. The same general technique may likewise be applied to a plurality of current sensors where the voltages are not obtained or otherwise not used to determine the power. It is to be understood that any suitable characteristic may be used to characterize the sensed signals, such as rising edge, falling edge, maximum, minimum, and/or zero crossing.

The present inventor determined that the complexity of the power meter may be simplified by coupling the automatic determination of the type of circuits together with its phase relationship, if applicable, with at least a partial configuration of the registers of the MODBUS and/or which registers of the MODBUS are populated with data suitable for the particular configuration. Moreover, in response to particular MODBUS requests only data from the populated registers should be provided. Also by limiting the applicable registers suitable for the particular configuration, the power meter may reduce its computational requirements in computing values for the applicable registers.

Referring to FIG. 4, if the system determines that a particular circuit is a single phase circuit (e.g., phase A) then the selected MODBUS point map may include registers specific to the single phase circuit and omit other configurations. For example, the real power on phases B and C may be omitted from the corresponding point map. For example, voltage phases for phases B and C may be omitted from the corresponding point map. In general, one or more of the phase B and C dependent values (see, e.g., FIGS. 3A and 3B) may be omitted from the selected point map. Preferably, all phase B and C dependent values may be omitted from the selected point map. Also, the power meter may likewise not compute the values for the omitted registers from the selected point map. In the case that the MODBUS point map includes one or more registers corresponding to phase B and/or phase C then the power meter may omit attempting to calculate values corresponding to such registers. Such selective computation reduces the computational complexity of the system. When such selective computation is coupled with a reduced MODBUS point map, additional MODBUS registers are available for other circuits, especially suitable for a power meter having multiple circuits.

Referring to FIG. 5, if the system determines that a particular circuit is a two phase circuit (e.g., phases A and B) then the selected MODBUS point map may include registers specific to the two phase circuit and omit other configurations. Some or all of the single phase circuit MODBUS point map registers may be included, if desired. For example the real power on phase C may be omitted from the corresponding point map. For example, voltage phase for phase C may be omitted from the corresponding point map. In general, one or more of the phase C dependent values (see, e.g., FIGS. 3A and 3B) may be omitted from the selected point map. Preferably, all the phase C dependant values may be omitted from the selected point map. Also, the power meter may likewise not compute the values for the omitted registers from the selected point map. In the case that the MODBUS point map includes one or more registers corresponding to phase C then the power meter may omit attempting to calculate values corresponding to such registers. Such selective computation reduces the computational complexity of the system. When such selective computation is coupled with a reduced MODBUS point map, additional MODBUS registers are available for other circuits, especially suitable for a power meter having multiple circuits.

Referring to FIG. 6, if the system determines that a particular circuit is a three phase circuit (e.g., phases A, B, and C) then the selected MODBUS point map may include registers specific to the three phase circuit and omit other configurations. Some or all of the single and two phase circuit MODBUS point map registers may be included, if desired. For example, the total power of the circuit based on only phase A, only phase B, or phases A and B may be omitted, if desired. In general, one or more of the non-three phase related values may be omitted from the selected point map. Preferably, all the non-three phase dependant or related values may be omitted from the selected point map. Also, the power meter may likewise not compute the values for the omitted registers from the selected point map. In the case that the MODBUS point map includes one or more registers corresponding specifically to single and two phase circuits then the power meter may omit attempting to calculate values corresponding to such registers. Such selective computation reduces the computational complexity of the system. When such selective computation is coupled with a reduced MODBUS point map, additional MODBUS registers are available for other circuits, especially suitable for a power meter having multiple circuits.

The techniques described herein are likewise applicable to multi-circuit current based circuits where the power is not computed or otherwise determined. With a reduced size of the MODBUS point map for one or more circuits of the power meter, when a MODBUS master makes a request for all MODBUS data for a particular circuit and/or all available circuits, the time required to provide relevant data may be significantly reduced. The techniques described herein are likewise applicable to providing data in other formats, such as for example, serial outputs, digital outputs, 4-20 mA outputs, pulse outputs, etc. In some cases, the energy measurement system may be a two phase or three phase meter where the different phases of the meter (e.g., current transformers) may be individually attached to a corresponding phase of a circuit, and in some cases inadvertently attached to the improper corresponding phase of the circuit.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A system comprising:
   (a) an elongate support board;
   (b) said elongate board electrically interconnected to at least four current sensors by a respective flexible wire between said elongate circuit board and respective ones of said at least four current sensors;
   (c) each of said current sensors spaced apart along a length of said elongate support board, and spaced apart from said elongate support board, suitable that wires from respective circuit breakers pass through a respective said current sensor;
   (d) a set of electrical traces are supported by said elongate support board and electrically interconnected to a respective said current sensors;
   (e) a first set of at least four board connectors supported by said elongate support board that receives signals based upon signals from a respective one of said at least four current sensors;
   (f) each of said four current sensors is a split core current sensor that is suitable to be opened with a respective said conductor to be inserted therein and suitable to be closed with said respective said conductor maintained therein;
   (g) each of said four current sensors interconnected with said respective flexible wire to a respective one of a second set of at least four current sensor connectors at a respective terminal portion thereof, where a respective one of said second set of current sensor connectors detachably interconnect with a respective one of said first set of board connectors supported by said elongate support board, such that the spacing between each said respective flexible wire connected to said circuit board are spaced apart to match a respective said conductor extending out from a respective circuit breaker of an electrical distribution panel.

2. The system of claim 1 wherein said elongate support board extends along a length of said circuit breakers.

* * * * *

UNITED STATES PATENT AND TRADEMARK OFFICE
CERTIFICATE OF CORRECTION

PATENT NO.        : 9,689,899 B2
APPLICATION NO.   : 14/946095
DATED             : June 27, 2017
INVENTOR(S)       : Martin Cook et al.

Page 1 of 1

It is certified that error appears in the above-identified patent and that said Letters Patent is hereby corrected as shown below:

On the Title Page

Item (57):
Change "A power monitors determines" to read –a power monitor determines–.

In the Specification

Column 3, Line 25:
After "monitor" delete "the".

Column 4, Line 47:
Change "waveform:" to read –waveform.–;

Column 4, Line 65:
Before "volt-amperes" insert --of--.

Column 6, Line 67:
Change "data for would" to read –data would–.

Signed and Sealed this
Seventeenth Day of April, 2018

Andrei Iancu
*Director of the United States Patent and Trademark Office*